(12) United States Patent
Gluschenkov et al.

(10) Patent No.: US 9,412,658 B2
(45) Date of Patent: Aug. 9, 2016

(54) CONSTRAINED NANOSECOND LASER ANNEAL OF METAL INTERCONNECT STRUCTURES

(71) Applicants: International Business Machines Corporation, Armonk, NY (US); GLOBALFOUNDRIES Inc., Grand Cayman, KY (US)

(72) Inventors: Oleg Gluschenkov, Tannersville, NY (US); Siddarth A. Krishnan, Peekskill, NY (US); Joyeeta Nag, Wappingers Falls, NY (US); Andrew H. Simon, Fishkill, NY (US); Shishir Ray, Clifton Park, NY (US)

(73) Assignees: INTERNATIONAL BUSINESS MACHINES CORPORATION, Armonk, NY (US); GLOBALFOUNDRIES INC., Grand Cayman (KY)

( * ) Notice: Subject to any disclaimer, the term of this patent is extended or adjusted under 35 U.S.C. 154(b) by 7 days.

(21) Appl. No.: 14/490,792

(22) Filed: Sep. 19, 2014

(65) Prior Publication Data
US 2016/0086849 A1    Mar. 24, 2016

(51) Int. Cl.
*H01L 23/52*      (2006.01)
*H01L 23/522*    (2006.01)
(Continued)

(52) U.S. Cl.
CPC .... *H01L 21/76894* (2013.01); *H01L 21/76834* (2013.01); *H01L 21/76883* (2013.01);
(Continued)

(58) Field of Classification Search
CPC ............... H01L 21/76883; H01L 21/76877; H01L 21/768; H01L 23/532; H01L 21/76834; H01L 21/76898

USPC ......................................................... 438/687
See application file for complete search history.

(56) References Cited

U.S. PATENT DOCUMENTS

| 6,043,153 | A | 3/2000 | Nogami et al. |
| 6,103,624 | A | 8/2000 | Nogami et al. |

(Continued)

OTHER PUBLICATIONS

Razak, S.N. et al., "Crystallization of Polycrystalline Silicon Thin Film by Excimer Laser Annealing, ELA" 2010 International Conference on Enabling Science and Nanotechnology (ESciNano) (Dec. 1-3, 2010) 2 pages.

(Continued)

*Primary Examiner* — Victor A Mandala
*Assistant Examiner* — Regan J Rundio
(74) *Attorney, Agent, or Firm* — Scully, Scott, Murphy & Presser, P.C.; Steven J. Meyers, Esq.

(57) ABSTRACT

In-situ melting and crystallization of sealed cooper wires can be performed by means of laser annealing for a duration of nanoseconds. The intensity of the laser irradiation is selected such that molten copper wets interconnect interfaces, thereby forming an interfacial bonding arrangement that increases specular scattering of electrons. Nanosecond-scale temperature quenching preserves the formed interfacial bonding. At the same time, the fast crystallization process of sealed copper interconnects results in large copper grains, typically larger than 80 nm in lateral dimensions, on average. A typical duration of the annealing process is from about 10's to about 100's of nanoseconds. There is no degradation to interlayer low-k dielectric material despite the high anneal temperature due to ultra short duration that prevents collective motion of atoms within the dielectric material.

19 Claims, 10 Drawing Sheets

(51) Int. Cl.
*H01L 21/768* (2006.01)
*H01L 23/532* (2006.01)
*H01L 21/4763* (2006.01)

(52) U.S. Cl.
CPC .... *H01L23/53228* (2013.01); *H01L 23/53233* (2013.01); *H01L 23/53238* (2013.01); *H01L 23/53295* (2013.01); *H01L 2924/01029* (2013.01)

(56) References Cited

U.S. PATENT DOCUMENTS

| | | | |
|---|---|---|---|
| 6,566,261 B2 * | 5/2003 | Ikegami et al. | 438/687 |
| 6,664,187 B1 * | 12/2003 | Ngo et al. | 438/687 |
| 6,727,176 B2 * | 4/2004 | Ngo et al. | 438/660 |
| 6,737,747 B2 * | 5/2004 | Barth | H01L 21/31144 257/637 |
| 6,764,951 B1 | 7/2004 | van Ngo | |
| 6,835,657 B2 * | 12/2004 | Ong | 438/662 |
| 7,088,003 B2 * | 8/2006 | Gates et al. | 257/774 |
| 7,211,502 B2 * | 5/2007 | Yamazaki et al. | 438/597 |
| 7,335,611 B2 | 2/2008 | Ramaswamy et al. | |
| 7,462,269 B2 * | 12/2008 | Ritzdorf et al. | 205/102 |
| 7,507,667 B2 | 3/2009 | Yoo | |
| 8,188,599 B2 * | 5/2012 | Koike | 257/751 |
| 8,299,365 B2 | 10/2012 | Nguyen et al. | |
| 2004/0104481 A1 * | 6/2004 | Ong | H01L 21/7684 257/758 |
| 2005/0285269 A1 * | 12/2005 | Cao | H01L 21/76877 257/758 |
| 2011/0266676 A1 * | 11/2011 | Isobayashi | H01L 21/76831 257/751 |
| 2012/0104622 A1 * | 5/2012 | Kim | H01L 21/76804 257/774 |
| 2013/0119509 A1 | 5/2013 | Farooq et al. | |
| 2014/0138848 A1 * | 5/2014 | Matsuura | H01L 23/481 257/774 |

OTHER PUBLICATIONS

Hu, C.K. et al., "Electromigration in Cu(Al) and Cu(Mn) damascene lines" Journal of Applied Physics (May 2012) pp. 093722-1-093722-6, vol. 111, No. 9.

Nogami, T. et al., "High Reliability 32 nm Cu/ULK BEOL Based on PVD CuMn Seed, and its Extendibility" 2010 IEEE International Electron Devices Meeting (IEDM) (Dec. 6-8, 2010) pp. 33.5.1-33.5.4.

* cited by examiner

CONSTRAINED NANOSECOND LASER ANNEAL OF METAL INTERCONNECT STRUCTURES

BACKGROUND

The present disclosure relates to a method of annealing metal interconnect structures employing nanosecond-scale laser irradiation.

Generally it is desirable to provide a copper interconnect structure in which copper grain size is large and residual stresses, seams, and voids are minimized within the copper interconnect structure. A typical copper interconnect anneal is conducted in a batch furnace at temperatures of less than 200° C. for several hours. Copper has a high plasticity even at such moderate temperatures. Superior copper plasticity coupled with a long anneal time is enough to reflow interconnects, relieve residual stresses, and to grow the grains. In addition to a dedicated copper annealing, formed copper wires are inadvertently annealed at about 375° C. for tens of minutes during depositing/curing subsequent insulating layers. Modern integrated circuits have multiple (up to 15-20) layers of copper interconnect levels. The bottom interconnect layers are affected by thermal treatments of subsequent interconnect layers resulting in additional copper grain growth in the bottom interconnect structures.

A wire resistivity reduction is typically associated with increased copper grains. Reduced electron scattering off the grain boundaries is responsible for this resistivity reduction. Accordingly, the reduction will be observable in both wide and thin copper wires where the average grain size increases from below to above, or about, the mean free path of free electrons in copper (~40 nm) and, more preferably, to above twice the mean free path of free electrons (~80 nm). In addition, copper deposition techniques promote textured (111) copper grains known as the bamboo or columnar grain structure. The bamboo grain structure exhibits less grain boundary scattering in the direction of current flow and is considered to be highly preferred.

Lateral and vertical scaling of copper interconnects to beyond about 80 nm or twice the mean free path of free electrons in copper leads to a nonlinear rise of copper wire resistance known as the interconnect size effect. The size effect becomes the dominant constraint on both interconnect scaling beyond about 40 nm and overall integrated chip (IC) performance due to much increased resistance of thin wires and narrow vias. The primary physical mechanism behind the size effect is the electron scattering off the interconnect interfaces. Interconnect interfaces may exhibit different types of electron scattering: diffused scattering and specular scattering. Diffused scattering is responsible for the nonlinear rise of copper wire resistance while the specular scattering does not affect wire resistance. Engineering copper wire interfaces is directed toward increasing specular scattering component over diffused scattering component.

Improving resistance of an integrated line and via structure within copper interconnect structures having widths less than, or on the order of, the mean free path of free electrons in copper has been notoriously difficult because high temperature anneal processes intended to decrease the resistance of the line portion of the integrated line and via structure tends to create voids near the via structure, thereby increasing the resistance of the via structure. The positive correlation between the size of Cu grains after an anneal process and frequency of a "copper pull" from a via structure to form a cavity is well known in the art.

SUMMARY

In-situ melting and re-crystallization of sealed copper wires can be performed by means of laser annealing for a duration of nanoseconds. The intensity of the laser irradiation is selected such that molten copper wets interconnect interfaces, thereby forming an interfacial bonding arrangement that increases specular scattering of electrons. Nanosecond-scale temperature quenching preserves the formed interfacial bonding. At the same time, the fast crystallization process of sealed copper interconnects results in large copper grains, typically larger than 80 nm in lateral dimensions, on average. A typical duration of the annealing process is from about 10's to about 100's of nanoseconds. There is no degradation to interlayer low-k dielectric material despite the high anneal temperature due to ultra short duration that prevents collective motion of atoms within the dielectric material.

According to an embodiment of the present disclosure, a method of annealing a metal interconnect structure is provided. A metal interconnect structure containing a metallic structure is provided. The metallic structure includes copper or a copper alloy that is embedded within at least one dielectric material layer located on a substrate. A bottom surface of a dielectric cap layer contacts an entire top surface of the metallic structure. A copper-containing portion of the metallic structure is melted by a laser irradiation. The metallic structure subsequently cools down. Recrystallization of a copper-containing portion of the metallic structure occurs during a cool down period after the laser irradiation.

DETAILED DESCRIPTION

As stated above, the present disclosure relates to a method of annealing metal interconnect structures employing laser irradiation. Aspects of the present disclosure are now described in detail with accompanying figures. It is noted that like reference numerals refer to like elements across different embodiments. The drawings are not necessarily drawn to scale. It is understood that multiple instances of any element illustrated in the drawings of the instant application can be formed employing the methods of the present disclosure. As such, references to a single element can be applied to a plurality of elements of the same kind, and vice versa.

Figure 1A:
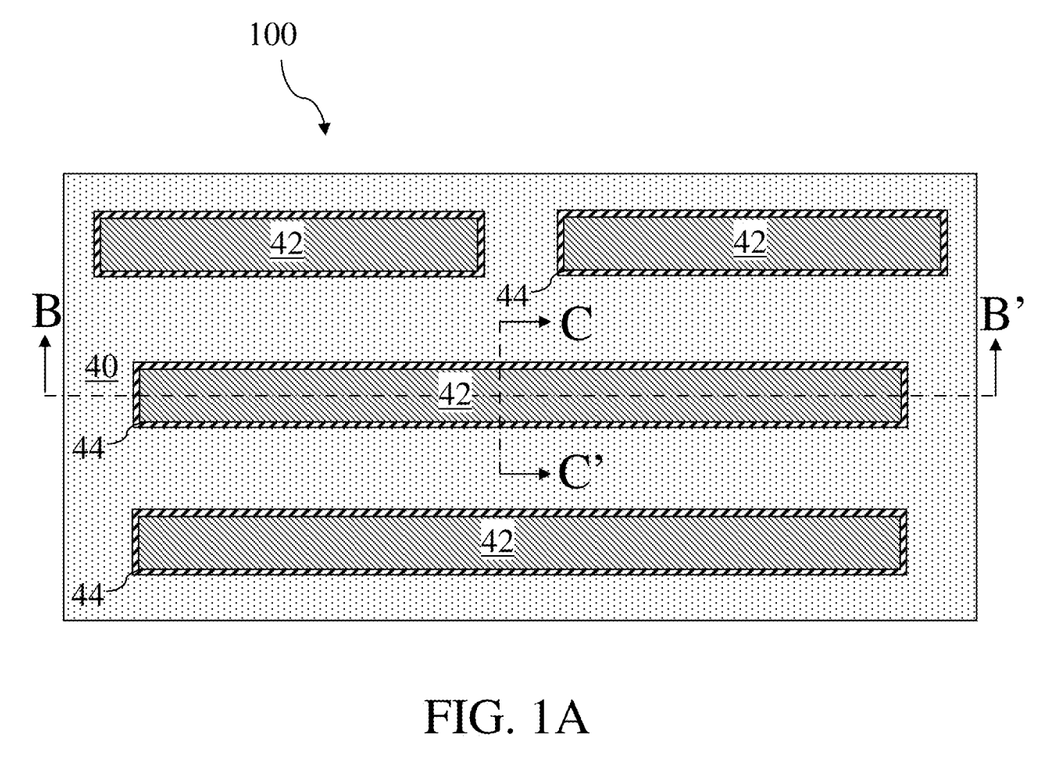
FIG. 1A is a horizontal cross-sectional view of an exemplary structure along the horizontal plane A-A' shown in FIG. 1B prior to a laser anneal according to an embodiment of the present disclosure. A dielectric cap layer 49 is not shown in FIG. 1A for clarity.
Figure 1B:
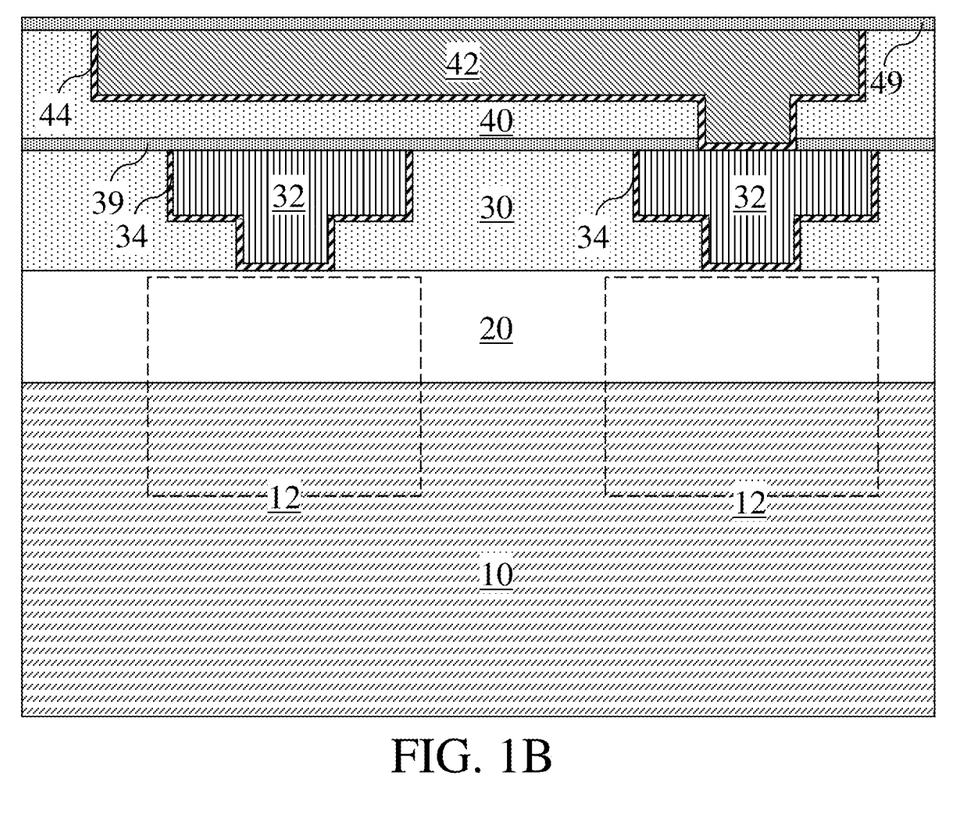
FIG. 1B is a vertical cross-sectional view of the exemplary structure of FIG. 1A along the vertical plane B-B' shown in FIG. 1A.

Referring to FIGS. 1A and 1B, an exemplary structure 100 according to an embodiment of the present disclosure includes a substrate 10, a device-containing layer 20, and a metal interconnect structure formed thereupon. The substrate 10 can be a semiconductor substrate, an insulator substrate, or a conductive substrate. The substrate 10 can have sufficient thickness and mechanical strength to support the overlying structures as an integral structure during subsequent processing. If the substrate 10 is a semiconductor substrate, the substrate 10 may be a bulk semiconductor substrate as known in the art, or may be a semiconductor-on-insulator (SOI) substrate as known in the art. In one embodiment, the substrate 10 can be a semiconductor substrate having at least one semiconductor device 12 thereupon.

The device-containing layer 20 can include a dielectric material layer. If the at least one semiconductor device 12 is present, the dielectric material layer within the device-containing layer 20 can embed the at least one semiconductor device 12. The at least one semiconductor device 12 can include any semiconductor device(s) known in the art. The dielectric material layer 12 includes a dielectric material such as silicon oxide, silicon nitride, porous or non-porous organosilicate glass (OSG), or combinations thereof. In one embodiment, the device-containing layer 20 can embed gate structures of field effect transistors that are a subset of the at least one semiconductor device 12. In one embodiment, the top surface of the device-containing layer 20 can be planar.

The metal interconnect structure can include an underlying dielectric material layer 30 embedding underlying metallic structures (32, 34). As used herein, the term "underlying" refers to the relationship of a relative location for a first element with respect to a second element that is located above the first element. As such, the underlying dielectric material layer 30 underlies a dielectric material layer 40, and each underlying metallic structure (32, 34) underlies a metallic structure (42, 44).

The underlying dielectric material layer 30 can include any dielectric material that is known to be suitable for formation of conductive lines and/or conductive vias therein. The underlying metallic structures (32, 34) can include any metal lines and/or metal via structures that can be embedded within the underlying dielectric material layer 30. Each underlying metallic structure (32, 34) can include an underlying metallic liner 32 and an underlying metal portion 34. The combination of the underlying dielectric material layer 30 and underlying metallic structures (32, 34) provide electrically conductive paths that provide electrical connections horizontally and/or vertically. An underlying dielectric cap layer 39 may be formed directly on the top surfaces of the underlying metallic structure (32, 34) and the underlying dielectric material layer 30.

While only a single instance of an underlying dielectric layer 30 (with the underlying metallic structures (32, 34) embedded therein) is illustrated in the drawings, it is understood that multiple instances of an underlying dielectric layer 30 (within the corresponding embedded underlying metallic structures (32, 34) for each underlying dielectric layer 30) can be stacked vertically to constitute a lower portion of the metal interconnect structure. Further, it is understood that the underlying dielectric material layer 30 (and the underlying metallic structures (32, 34) embedded therein) may be omitted if desired. Yet further, it is understood that one or more of the underlying dielectric layers 30 (with the corresponding underlying metallic structures (32, 34) embedded therein) may be formed employing the methods of the present disclosure, i.e., the laser anneal method described below. As such, the methods of the present disclosure for forming and processing the dielectric material layer 40 and the embedded structures therein can be iteratively used to form one or more of the underlying dielectric layers 30 (with the corresponding underlying metallic structures (32, 34) embedded therein) and/or additional dielectric layers (with the corresponding underlying metallic structures embedded therein) that can be formed over the dielectric material layer 40 after the processing steps to be described below. In other words, the methods of the present disclosure can be employed to form any of the dielectric material layers in a metal interconnect structure provided that the conductive material portion within the corresponding dielectric material layer predominantly includes copper.

The metal interconnect structure can further include a dielectric material layer 40 embedding metallic structures (42, 44) therein. The dielectric material layer 40 may comprise an oxide based conventional dielectric material, which has a dielectric constant k from about 3.6 to about 3.9, or a low-k dielectric material, which has a dielectric constant k of about 3.0 or less, preferably less than about 2.8, and more preferably less than about 2.5. Non-limiting examples of the oxide based conventional dielectric material included undoped silicate glass (USG), fluorosilicate glass (FSG), borophosphosilicate glass (BPSG), and phosphosilicate glass (PSG). The low-k dielectric material may be a spin-on low-k dielectric material or a CVD low-k dielectric material, i.e., a low-k dielectric material deposited by chemical vapor deposition (CVD). An example of the spin-on low-k dielectric material is a thermosetting polyarylene ether. The term "polyarylene" herein denotes aryl moieties or inertly substituted aryl moieties which are linked together by bonds, fused rings, or inert linking groups such as oxygen, sulfur, sulfone, sulfoxide, carbonyl, etc. Composition and deposition methods of the CVD low-k dielectric material are well known in the art. For example, the CVD low-k dielectric material may be a SiCOH dielectric containing a matrix of a hydrogenated oxidized silicon carbon material (SiCOH) comprising atoms of Si, C, O and H in a covalently bonded tri-dimensional network. Both the spin-on low-k dielectric material and the CVD low-k dielectric material may be porous, which decreases the dielectric constant of the dielectric material layer 40. The dielectric material layer 40 may comprise a stack of at least two of the oxide based conventional dielectric material, the spin-on low-k dielectric material, and the CVD low-k dielectric material.

The thickness of the dielectric material layer 40 may be from 50 nm to about 2 μm, and typically from 100 to about 500 nm, although lesser and greater thicknesses are explicitly contemplated herein. Each metallic structure (42, 44) can be a conductive line structure that provides a horizontally conductive path for electrical signals, a conductive via structure that provide a vertically conductive path for electrical signals, or an integrated line and via structure that provides an electrically conductive path between locations that are vertically and laterally spaced from each other. The metallic structure(s) (42, 44) can be formed, for example, by applying and patterning at least one photoresist layer over the top surface of the dielectric material layer 40, by transferring the pattern in the at least one photoresist layer partially or fully into the dielectric material layer 40, and by depositing at least one conductive material within the cavities formed within the dielectric material layer 40 and removing excess portions of the at least one conductive material from above the top surface of the dielectric material layer 30, for example, by chemical mechanical planarization. At least one temporary material layers may be employed to facilitate the patterning and/or the planarization process.

In an illustrative example, a contiguous metallic liner may be deposited onto the surfaces of the cavities within the dielectric material layer 40 during deposition of the at least one conductive material. The contiguous metallic liner can be deposited by physical vapor deposition (PVD), i.e., sputtering, chemical vapor deposition (CVD), atomic layer deposition (ALD) electroplating, electroless plating, or a combination thereof. The contiguous metallic liner comprises an elemental metal or a metallic compound that provides good adhesion to the dielectric material layer 40 and serves as a barrier for mobile ions and contaminants to protect metal portions to be formed thereupon, and prevents diffusion of the material of the metal portions into the dielectric material layer 40. For example, the contiguous metallic liner may comprise conductive metal nitrides, and metals including but not limited to Ti, Ta, Co, Ru. Non-limiting examples of conductive nitride include TiN, TaN, and WN. The material of the contiguous metallic liner provides higher electromigration resistance for a metallic structure to be formed.

The contiguous metallic liner may have the same, or different, thickness between a bottom portion that vertically abut the dielectric material layer 40, and sidewall portions that substantially laterally abut the dielectric material layer 40. The thickness of the bottom portion of the contiguous metallic liner is herein referred to as the thickness of the contiguous metallic liner. The thickness of the contiguous metallic liner may be from about 3 nm to about 60 nm, and typically from about 10 nm to about 30 nm, although lesser and greater thicknesses are explicitly contemplated herein. The ratio between the thickness of the sidewall portions of the contiguous metallic liner to the thickness of the bottom portion of the contiguous metallic liner, i.e., the "thickness of the metal liner," is referred to as step coverage.

A metal layer is subsequently deposited on the contiguous metallic liner. The metal layer may be formed by electroplating, electroless plating, physical vapor deposition (PVD, i.e., sputtering), chemical vapor deposition, or a combination thereof. For example, the metal layer may be formed by physical vapor deposition of a thin seed layer containing a metal and electroplating of the same metal. The metal layer includes copper as the predominant element, i.e., an element of which atomic percentage is at least 50%. As such, the metal layer is a copper-containing layer. Typically, the metal layer includes copper at an atomic concentration greater than 90%. The metal layer is formed directly on the contiguous metallic liner. The thickness of the metal layer is selected so that the entirety of the trenches below the horizontal plane including the topmost surface of the dielectric material layer 40 is filled within the metal layer after deposition of the metal layer.

The metal layer and the contiguous metallic liner can be planarized to form the metallic structure(s) (42, 44). For example, excess material of the metal layer above the topmost surface of the dielectric material layer 40 can be planarized, for example, by chemical mechanical polishing (CMP). The portions of the contiguous metallic liner above the topmost surface of the dielectric material layer 40 are also removed by CMP. Optionally, the portion of the contiguous metallic liner above the topmost surface of the dielectric material layer 40 may be employed as a stopping layer during the removal of the metal layer. In this case, the CMP process may be a two step process in which a first step is a self-stopping process that removes the portion of the metal layer above the topmost surface of the contiguous metallic liner, and a second step is a process that polishes the portion of the contiguous metallic liner and the metal layer above the topmost surface of the dielectric material layer 40.

After the CMP process, each remaining portion of the metal layer constitutes a copper-containing portion 42, and each remaining portion of the contiguous metallic liner constitutes a metallic liner 44. Each copper-containing portion 42 is a copper-containing portion that contains copper at an atomic concentration of at least 50%. Each combination of a metallic liner 44 and a copper-containing portion 42 embedded therein collectively constitute a metallic structure (42, 44). If a dual damascene method is employed, the metallic structure (42, 44) can be an integral line and via structure. The top surfaces of the metallic structure (42, 44) and the dielectric material layer 40 can be substantially coplanar, i.e., at about the same height without vertical protrusions or vertical recesses.

Optionally, a metallic cap layer (not shown) can be deposited on a top surface of the metallic structure (42, 44), for example, by electroplating. The metallic cap layer can include any electroplatable material such as CoWP.

A dielectric cap layer 49 may be formed directly on the top surfaces of the metallic structure (42, 44) and the dielectric material layer 40. The dielectric cap layer 39 typically comprises a non-porous dielectric material such as silicon nitride, silicon oxynitride, BLoK™ which is a low-k material containing Si, C, O, and H and formed by plasma enhanced chemical vapor deposition and provided, for example, by Applied Materials Inc.™, or NBLoK™ which is a low-k material containing Si, C, O, H, and N and formed by plasma enhanced chemical vapor deposition and provided, for example, by Applied Materials Inc.™ The thickness of the dielectric cap layer 49 may be from about 3 nm to about 90 nm, and typically from about 6 nm to about 40 nm, although lesser and greater thicknesses are also contemplated herein. The combination of the bottom surface of the dielectric cap layer 39, sidewalls and horizontal surfaces of the dielectric material layer 40, sidewalls of the underlying dielectric cap layer 36, and a top surface of an underlying metallic structure (32, 34) encapsulates, and contacts the entire surface of, the metallic structure (42, 44).

The metallic structure (42, 44) includes copper or a copper alloy that is embedded within at least one dielectric material layer (39, 40) located on a substrate 10. A bottom surface of the dielectric cap layer 49 contacts the entire top surface of the metallic structure (42, 44). The metallic structure (42, 44) includes a stack of a metallic liner 44 and the copper-containing portion 42 which is embedded within the metallic liner 44. Each surface of the metallic structure (42, 44) can be in physical contact with the at least one dielectric material layer (39, 40), an underlying metallic structure (32, 34) located underneath the metallic structure (42, 44), or the bottom surface of the dielectric cap layer 49. In one embodiment, the at least one dielectric material layer (39, 40) can include at least one of undoped silicate glass (USG), a doped silicate glass, a non-porous organosilicate glass (OSG), and a porous organosilicate glass. In one embodiment, the dielectric material layer 40 can include a dielectric material selected from a porous organosilicate glass (OSG) or a non-porous organosilicate glass, and the metallic structure (42, 44) can be in physical contact with the dielectric material of the dielectric material layer 40. In one embodiment, the metal interconnect structure can include a metal line having a uniform width. In another embodiment, the metal interconnect structure can include an integrated line and via structure including a metal line and at least one conductive via structure of integral construction with the metal line.

Figure 2:
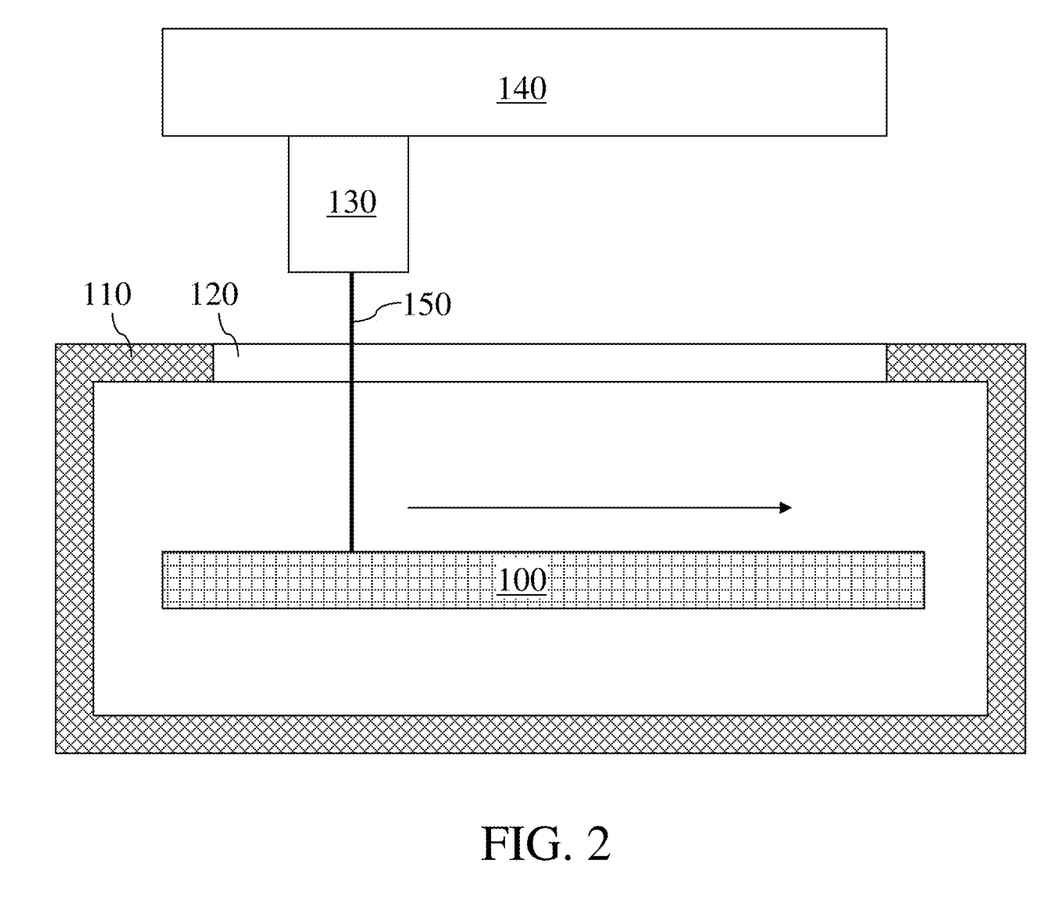
FIG. 2 is schematic view of an apparatus for performing a laser anneal according to an embodiment of the present disclosure.

Referring to FIG. 2, an apparatus for performing a laser anneal according to an embodiment of the present disclosure is illustrated in a state in which the exemplary structure 100 of FIGS. 1A and 1B is loaded within the apparatus and is irradiated by a laser beam 150. Specifically, the apparatus includes an enclosure including rigid walls 110 and a transparent window 120 configured to pass one or more laser beams through. The enclosure (110, 120) can be a vacuum-tight enclosure containing vacuum, a reactive environment, or an inert environment therein, or a simple environmental enclosure providing a purified air environment. In the case of simple environmental enclosure, structure 110 can encompass the entire assembly (130, 140) and the transparent window 120 is trivialized into an open space between assemblies (130, 140) and 100. Transparent window 120 can be made out of a solid transparent material and can be in the form of a gas curtain. The apparatus can further include at least one laser 130, which can be a single laser or a plurality of lasers.

The apparatus is provided with a mechanism for changing the beam position as observed at top surface of the exemplary structure 100. In one embodiment, a laser positioning device 140 may be provided to facilitate the changing of the beam position at the top surface of the exemplary structure 100. For example, the laser positioning device 140 can move each of the at least one laser 130 along horizontal directions so that scanning of the laser beam 150 over the exemplary structure 100 is possible. A possible direction of scanning of the laser beam is illustrated with an arrow. Alternatively or additionally, the apparatus may be provided with a mechanism for moving the exemplary structure 100 within the enclosure (110, 120). This mechanism can be a chuck (not shown) for mounting the exemplary structure 100 and for providing lateral movements to the mounted exemplary structure 100. Configurations with a stationary laser 130 and a mobile enclosure (110, 120) can be employed to minimize any potential exposure of wafer surface to particulates created in mechanical motion of components above wafer surface. The laser beam 150 is shaped and focused onto the wafer surface. The shape of the focused beam can vary from rectangle to a line. The laser beam 150 can be scanned over different areas of the at least one dielectric material layer (39, 40) in the exemplary structure 100 during the laser irradiation. Depending on the focused beam shape, the scanning pattern can vary from step-and-repeat suitable for rectangular beam shape to a pseudo-continuous scanning suitable for line-shaped beams. The size of focused beam rectangle can be aligned with the die layout such that entire die is exposed at once.

According to an embodiment of the present disclosure, the laser beam 150 is irradiated onto the surface of the exemplary structure 100 as a pulse having a total duration (measured at full width at half maximum) that does not exceed 200 ns. As used herein, a laser pulse or a combination of multiple laser pulses that has a total cumulative duration (measured by multiplying number of pulses to their respective durations at full width at half maximum) not exceeding 1,000 ns is herein referred to as an ultrashort laser pulse. An ultrashort laser pulse has been observed not to damage the dielectric materials in the dielectric cap layer 49, the dielectric material layer 40, the underlying dielectric cap layer 39, and the underlying dielectric material layers in the course of experiments leading to the present disclosure. The lack of damage in the dielectric materials in samples irradiated with an ultrashort laser pulse has been observed even for porous or non-porous organosilicate glass materials as well as silicon oxide-based materials. While not wishing to be bound by any particular theory, it is postulated that the short duration of the ultrashort laser pulse prevents, or suppresses, collective motion of atoms in solid dielectric materials of the dielectric cap layer 49, the dielectric material layer 40, the underlying dielectric cap layer 39, and the underlying dielectric material layers due to insufficient time to cause such motion at an elevated temperature below the respective melting points of these materials.

While the present invention produces better results in terms of eliminating, or minimizing, damage to the dielectric materials in a metal interconnect structure, it is expressly contemplated herein that the present invention can be practiced with at least one laser pulse having a total duration exceeding 200 ns. For example, the present invention may be practiced with at least one laser pulse having a total duration exceeding 1 microsecond but less than 10 microseconds, although such extension of irradiation time is expected to induce observable, and possibly significant, degradation in the quality of the dielectric material in the irradiated metal interconnect structure.

Figure 3A:
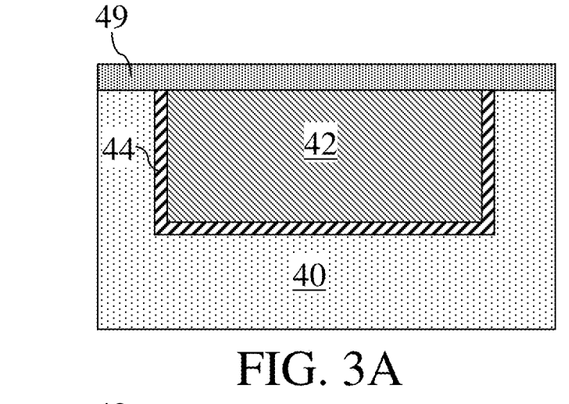
FIG. 3A is a vertical cross-sectional view of the exemplary structure along the vertical plane X-X' in FIG. 1A prior to a laser anneal according to an embodiment of the present disclosure.

Sequential changes in the microstructure of a metallic structure (42, 44) in the exemplary structure 100 of FIGS. 1A and 1B are schematically illustrated in FIGS. 3A-3D. Referring to FIG. 3A, a vertical cross-sectional view of the exemplary structure 100 prior to the laser anneal of the present disclosure is shown along the vertical plane X-X' in FIG. 1A. The metallic structure (42, 44) is embedded within the dielectric material layer 40, and the dielectric cap layer 49 seals the top surface of the metallic structure (42, 44).

At the processing step corresponding to FIG. 3A, grain boundaries that are present in the copper-containing portion 42 prevents a finite fraction of the inner surfaces of the metallic liner 44 from physically contacting the material of the copper-containing portion 42. The area at which the grain boundaries within the copper-containing portion 42 meet the surfaces of the metallic liner 44 is a finite area at which voids are present. In other words, microscopic voids are present at a finite fraction of the interface between the metallic liner 44 and the copper-containing portion 42, and thus, the material of the copper-containing portion 42 cannot contact the material of the metallic liner 44 at locations at which the voids at which the grain boundaries meet the surfaces of the material of the metallic liner 44.

Figure 3B:
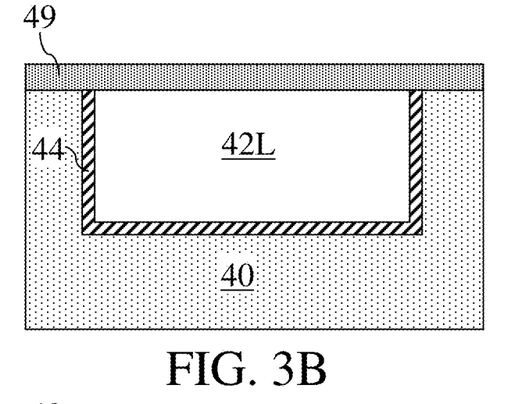
FIG. 3B is a vertical cross-sectional view of the exemplary structure along the vertical plane X-X' in FIG. 1A during laser irradiation that induces complete melting of a metal line according to an embodiment of the present disclosure.

Referring to FIGS. 1B and 3B, at least one laser 130 (See FIG. 2) is employed to irradiate the metal interconnect structure in the exemplary structure 100. A portion of the incident laser irradiation passes through the dielectric cap layer 49 and impinges on the metallic structure (42, 44) and dielectric material layer 40. Further, a portion of the laser radiation penetrates deeper into the exemplary structure 100 and impinges on the underlying metallic structure (32, 34). In the present invention, the dominant useful absorption of penetrated laser beam happens in the metallic structures (42, 44, 32, 34) rather than in the dielectric material layers (40, 30). The absorbed energy spreads through the thermal conduction in both metallic structures (42, 44, 32, 34) and the dielectric material layers (40, 30) heating the entire top surface of the exemplary structure 100.

The characteristic length of thermal spreading, equalization, or diffusion depends on the anneal duration. For a 100 ns annealing, the characteristic thermal diffusion length is about 1 micron in copper structures and about from 300 to 100 nm in the dielectric 40. For twice the annealing duration, the length increases by about 40%, or in proportion to the square root of the anneal duration. On the spatial scale of less than about one third of the characteristic thermal diffusion length, the temperature essentially equalizes leading to a relatively uniform annealing. Accordingly, tightly-pitched lateral metallic structures (42, 44) with the pitch of about 80 nm or less (for example, 40 nm-wide metallic structures (42, 44) and a 40 nm-wide portion of the dielectric material layer 40 that separates the metallic structures (42, 44)) are annealed at a nearly same temperature. Further, the energy absorbed in the metallic structure (42, 44) partially propagates to the underlying metallic structure 32 in addition to any laser energy that penetrates through the dielectric material layer 40 and is absorbed directly by the underlying metallic structure (32, 34). The advantage of having almost transparent materials for the dielectric cap layer 49 and the dielectric material layer 40 in conjunction with absorbing metallic structure (42, 44, 32, 34) is that several layers of stacked metallic structures (42, 44, 32, 34), typically from 2 to 5 stacked metallic structures and preferably 3 stacked structures, can be annealed at nearly same temperature with a single laser exposure. Thus, according to an embodiment of the present disclosure, a plurality of metallic structures (42, 44, 32, 34) can be annealed simultaneously by a single process of laser irradiation that melts each of the copper-containing portions (42, 32) located at different levels to melt and to recrystallized simultaneously.

The energy and intensity of the laser beam 150 is selected such that the entirety of the copper-containing portion 42 in the metallic structure (42, 44) is melted by the laser irradiation. The local temperature of the metallic structure (42, 44) reaches at least the melting point of the copper-containing portion during the laser irradiation. While the melting temperature of pure copper is 1,085° C., presence of other metallic elements such as Mn and/or formation of a eutectic can alter the melting temperature of the copper-containing alloy in the copper-containing portion 42. In one embodiment, the melting temperature of the copper-containing portion 42 can be greater than 1,000° C. and less than 1,100° C. In another embodiment, 2 to 5 stacked copper-containing metallic structures (42, 44, 32, 34) can be melted and subsequently recrystallized at the same time. In yet another embodiment, 3 stacked copper-containing metallic structures (42, 44, 32, 34) can be melted and subsequently recrystallized at the same time. In still another embodiment, two stacked copper-containing metallic structures (42, 44, 32, 34) can be melted and subsequently recrystallized.

In one embodiment, the laser irradiation can be performed by irradiating a single laser pulse or a plurality of laser pulses that impinges onto the metal interconnect structure. In one embodiment, the laser irradiation can be performed by at least one laser pulse that is irradiated within a time period having a duration less than 1 microsecond. In another embodiment, the total duration of the single laser pulse or the plurality of laser pulses can be less than 200 ns. In another embodiment, the total duration of the single laser pulse or the plurality of laser pulses can be in a range from 1 ns to 60 ns. In yet another embodiment, the total duration of the single laser pulse or the plurality of laser pulses can be in a range from 5 ns to 40 ns. In still another embodiment, the total duration of the single laser pulse or the plurality of laser pulses can be in a range from 10 ns to 30 ns.

The wavelength of laser irradiation is preferably selected from visible and near ultraviolet (UV) ranges. Longer infrared wavelength results in excessive reflection from metallic structures while much shorter UV wavelength results in excessive absorption by the dielectric structures. Accordingly, an intermediate range of wavelength from about 600 nm to about 200 nm is preferred. Pulsed high-power lasers operating at around 532 nm, 308 nm, and 266 nm are highly preferred.

To minimize required laser power and intensity as well as the resultant temperature variability, the exemplary structure 100 can be preheated prior to the laser pulse exposure. Safe pre-heat temperature depends on thermal stability of the various dielectric layers (30, 39, 40, 49) and the metallic structures (42, 44, 32, 34) and the preheat duration. In one embodiment, the preheat is conducted by a hot plate disposed underneath exemplary structure 100 at temperature of lower than 375° C. for the duration of minutes. In another embodiment, the preheat is conducted via rapid thermal annealing with typical duration of tens of seconds at temperatures of less than about 450° C. In yet another embodiment, the preheat is conducted via millisecond annealing with typical duration of about 1 ms at temperatures of less than 700° C. The millisecond annealing can be conducted via a millisecond laser anneal that is well known in the art and principally different from the nanosecond pulsed laser anneal practiced in this invention.

The copper-containing portion 42 as melted by laser irradiation is herein referred to as a liquid copper-containing portion 42L. A wettable interface is formed between the metallic liner 44 and the liquid copper-containing portion 42L, i.e., the copper-containing portion 42 in the melted state, during the laser irradiation. As used herein, a "wettable" interface refers to an interface at which a wetting of a solid surface occurs by a liquid in physical contact with the solid surface. Molten copper-containing alloy wets surfaces of metals or metallic nitrides of the metallic liner 44, i.e., contacts the entire surfaces of the metallic liner 44. The wetting property of solid-liquid interface is also indicative of superior bonding between the liquid and the solid such that the number of energetic dangling bonds at the interface is minimized. The voids, which were previously present at the locations at which grain boundaries of the copper-containing portion 42 met the surfaces of the material of the metallic liner 44, disappear as the copper-containing portion 42 melts to form a liquid phase. Formation of a contiguous wettable interface between the metallic liner 44 and the liquid copper-containing portion 42L causes any preexisting gap in the physically contact area between the metallic liner 44 and the material of the copper-containing portion 42 to disappear.

In one embodiment, the dielectric cap layer 49 can also include a material that can be wetted by the liquid copper-containing portion 42L. For example, the dielectric cap layer 49 can include a material such as NBLoK™, which is a low-k material containing Si, Co, O, H, and N. In this case, the liquid copper-containing portion 42L wets the bottom surface of the dielectric cap layer 49. In this case, the voids, which were previously present at the locations at which grain boundaries of the copper-containing portion 42 met the bottom surface of the dielectric cap layer 49, disappear as the copper-containing portion 42 melts to form a liquid phase. The wetting property of dielectric-liquid Cu interface is also indicative of superior bonding between the liquid Cu and the NBLoK™ such that the number of energetic dangling bonds at the interface is minimized.

In one embodiment, the copper-containing portion 42 prior to melting can include non-copper elements such as Mn and/or carbon. The total atomic concentration of each of the non-copper elements in the copper-containing portion 42 may, or may not, exceed the solubility limit of the non-copper element. If the total atomic concentration of a non-copper element in the copper-containing portion 42 exceeds the solubility limit of the non-copper element in the liquid phase, excess atomic concentration of the non-copper element is pushed out from the liquid copper-containing portion 42L as precipitates to the interfaces between the liquid copper-containing portion 42L and the metallic liner 44 or the dielectric cap layer 49. In other words, excess amount of the non-copper elements above the solubility limit in copper are present only at the interfaces between the liquid copper-containing portion 42L and the metallic liner 44 or the dielectric cap layer 49 while the liquid copper-containing portion 42L fills the entire volume defined by the inner surfaces of the metallic liner 44 and the bottom surface of the dielectric cap layer 49.

Figure 3C:
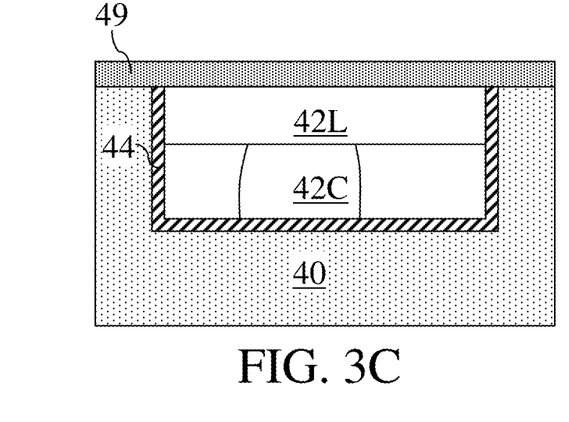
FIG. 3C is a vertical cross-sectional view of the exemplary structure along the vertical plane X-X' in FIG. 1A during a cool-down period after laser irradiation according to an embodiment of the present disclosure.

Once the laser irradiation stops, the liquid copper-containing portion 42L is gradually transformed into a recrystallized copper-containing portion 42C. The recrystallized copper-containing portion 42C nucleates from the regions at which the thermal loss of the liquid copper-containing portion 42L is the greatest, i.e., at the interface between the liquid copper-containing portion 42L and the metallic liner 44 as shown in FIG. 3B. Thermal diffusion is the primary mechanism of thermal loss at these short time scales. Typically, the recrystallized copper-containing portion 42C nucleates at the interface between the bottom surface of the liquid copper-containing portion 42L and a horizontal top surface of the metallic liner 44 as illustrated in FIG. 3C, because the thermal diffusion is directed toward the exemplary structure 100. While the drawings of the present disclosure illustrates copper re-crystallization in the single metallic layer, it is clear to one of ordinary skill in the art that the same process can be simultaneously duplicated across multiple layers containing metallic structures (42, 444, 32, 34). In other words, similar processes can occur in the multiple stacked layers where metallic structures (42, 44, 32, 34) more than one layer melts at the same time. In this case, the nucleation starts from the bottom of the last molten layer and proceeds upward.

Figure 3D:
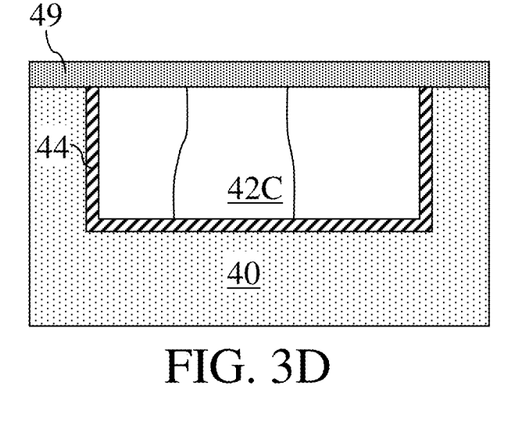
FIG. 3D is a vertical cross-sectional view of the exemplary structure after cool-down according to an embodiment of the present disclosure.
Figure 4A:
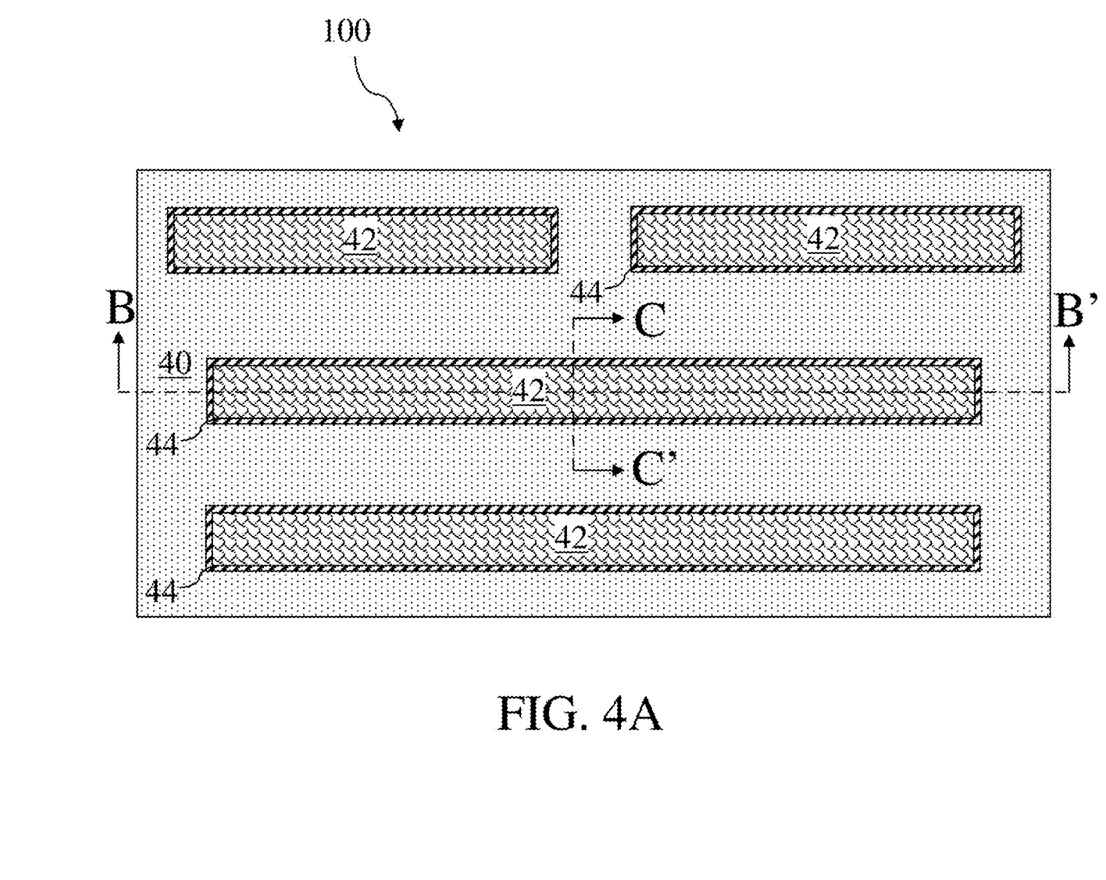
FIG. 4A is a horizontal cross-sectional view of the exemplary structure along the horizontal plane A-A' shown in FIG. 4B after the laser anneal according to an embodiment of the present disclosure.
Figure 4B:
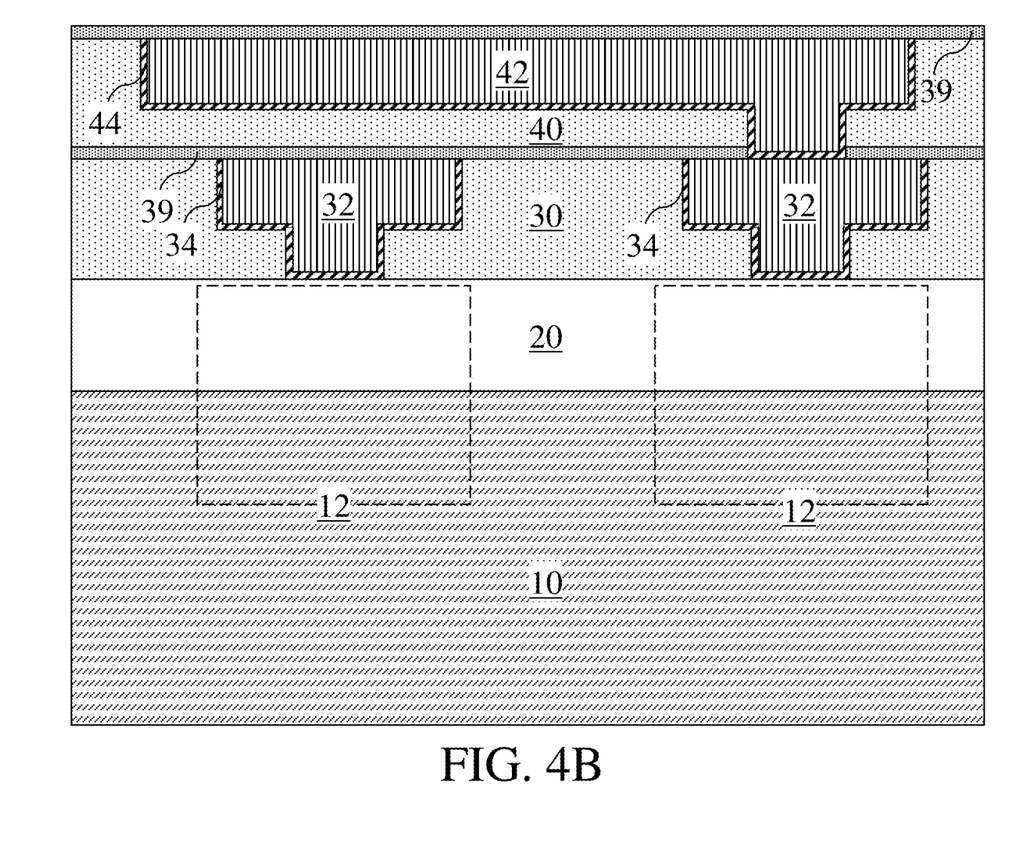
FIG. 4B is a vertical cross-sectional view of the exemplary structure of FIG. 4A along the vertical plane B-B' shown in FIG. 4A.

Recrystallization of the liquid copper-containing portion 42L, i.e., the copper-containing portion 42 in the liquid state, of the metallic structure (42L, 44) occurs during a cool down period after the laser irradiation. In one embodiment, the recrystallization of the liquid copper-containing portion 42L can proceed from a bottom surface and sidewall surfaces of the liquid copper-containing portion 42L (which is the melted state of the copper-containing portion 42) toward a top surface of the liquid copper-containing portion 42L. As the cool down of the liquid copper-containing portion 42L continues, the size of the recrystallized copper-containing portion 42C increases until the entire liquid copper-containing portion 42L is converted into the recrystallized copper-containing portion 42C illustrated in FIG. 3D. The exemplary structure 100 after the laser anneal and cooling is illustrated in FIGS. 4A and 4B.

The recrystallized copper-containing portion 42C has an increased grain size relative to the copper-containing portion 42 prior to the laser anneal. Typically, the copper-containing portion 42 prior to the laser anneal has grain sizes that are lesser than the mean free path of electrons in copper, which is about 40 nm. The grain size of the recrystallized copper-containing portion 42C within structures having dimensions greater than the mean free path of electrons in copper can be greater than the mean free path of electrons in copper, and may be greater than the mean free path of electrons in copper by factors greater than 2, and in some cases, by orders of magnitude.

The large size of the grains in the recrystallized copper-containing portion 42C is induced by the wetting properties of the liquid copper-containing portion 42C. As discussed above, voids are eliminated at the interface between the liquid copper-containing portion 42L and the metallic liner 44 and at the interface between the liquid copper-containing portion 42L and the dielectric cap layer 49. Thus, each grain of the recrystallized copper-containing portion 42C can laterally expand without running into mechanisms that limit the growth of the grain. In one embodiment, the entirety of the recrystallized copper-containing portion 42C may have less than 10 grains. In another embodiment, the entirety of the recrystallized copper-containing portion 42C may have 3 grains or less. In yet another embodiment, the entirety of the recrystallized copper-containing portion 42C may have only one grain. The crystallographic orientations of the grains in the recrystallized copper-containing portion 42C are expected to be predominantly along the <111> orientation, which is the direction of the lowest energy configuration for crystalline copper grains.

As discussed above, the atomic concentration of non-copper elements cannot exceed the solubility limit of the non-copper element and excess non-copper elements can be present only as precipitates at the interface between the liquid copper-containing portion 42L and the metallic liner 44 and at the interface between the liquid copper-containing portion 42L and the dielectric cap layer 49. As a consequence, in case a non-copper element is present in the copper-containing alloy at an atomic concentration that exceeds the solubility limit of the non-copper element, the recrystallized copper-containing portion 42C includes the non-copper element at the solubility limit of the non-copper element in copper, and the rest of the non-copper element is present only at the interface between the recrystallized copper-containing portion 42C and the metallic liner 44 and at the interface between the recrystallized copper-containing portion 42C and the dielectric cap layer 49. Thus, at least one non-copper element in the copper-containing portion 42 segregates to a top surface of the recrystallized copper-containing portion 42C during the recrystallization process. If Mn is present within the copper-containing portion 42 prior to anneal, for example, due to diffusion from a Mn-containing metallic liner, melting the copper-containing portion 42 into the liquid copper-containing portion 42L promotes Mn segregation out of the liquid copper-containing portion 42L and subsequently from a re-crystallized copper-containing portion because its energetically more favorable to have Mn clusters outside of the liquid copper-containing portion 42L than to have Mn clusters distributed within the liquid copper-containing portion 42L or a recrystallized structure obtained therefrom.

The speed of re-crystallization is governed by the speed of thermal diffusion and is of the order of billions degrees per second. At this speed, the preferred bonding arrangements that existed at both wettable interfaces (molten Cu-dielectric cap and molten Cu-metallic liner) is preserved due to such superfast temperature quenching. This promotes specular scattering for these interfaces.

As discussed above, the dielectric materials of the at least one dielectric layer (39, 40) and the dielectric cap layer 49 are not damaged in any detectable manner by the laser anneal. Thus, any portion of the dielectric material in contact with the metallic structure (42, 44) can have the same composition prior to the laser irradiation and after the recrystallization of the metallic structure (42C, 44).

Figure 5:
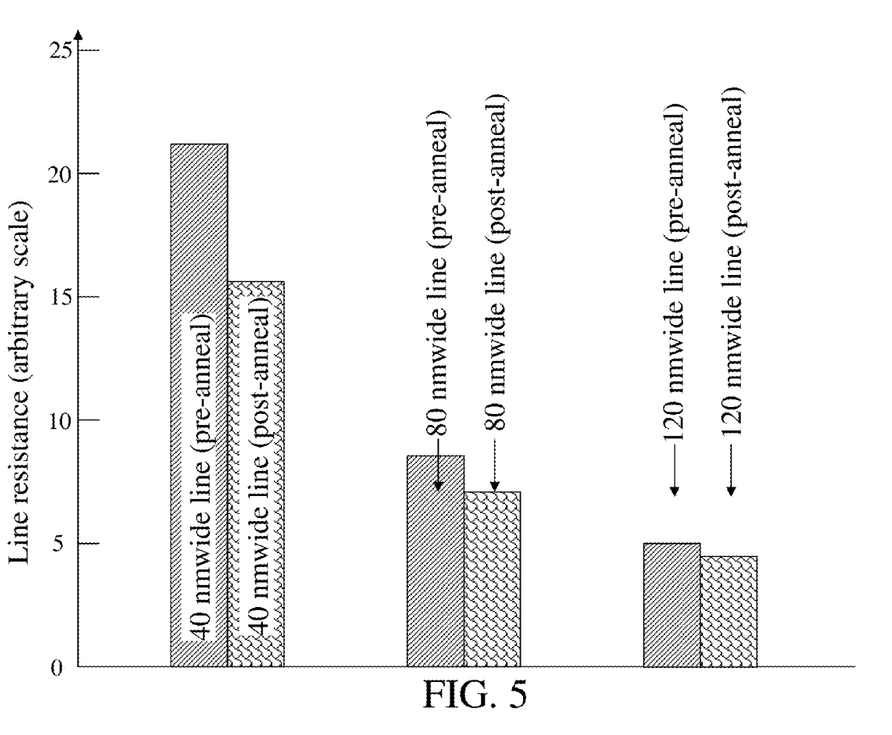
FIG. 5 is a bar chart illustrating reduction in metal line resistance for Cu lines having different widths according to an embodiment of the present disclosure.

Referring to FIG. 5, reduction in metal line resistance for Cu lines having different widths through the laser anneal process of the present disclosure is illustrated in a bar graph. The widths of the metal lines for the samples were 40 nm, 80 nm, and 120 nm. The thickness of the metal lines was about 80 nm and the total height of the line-via integrated structure was about 120 nm. A 20 ns anneal by a 532 nm wavelength laser at the effective laser power of 2.5 mJ/mm$^2$ was employed for all samples. Reduction by more than 20% in line resistance was observed for metal line structures having the width 40 nm. The percentage reduction in line resistance was independent of the lengths of the metal lines provided that the metal lines were wider than 400 nm.

Figure 6:
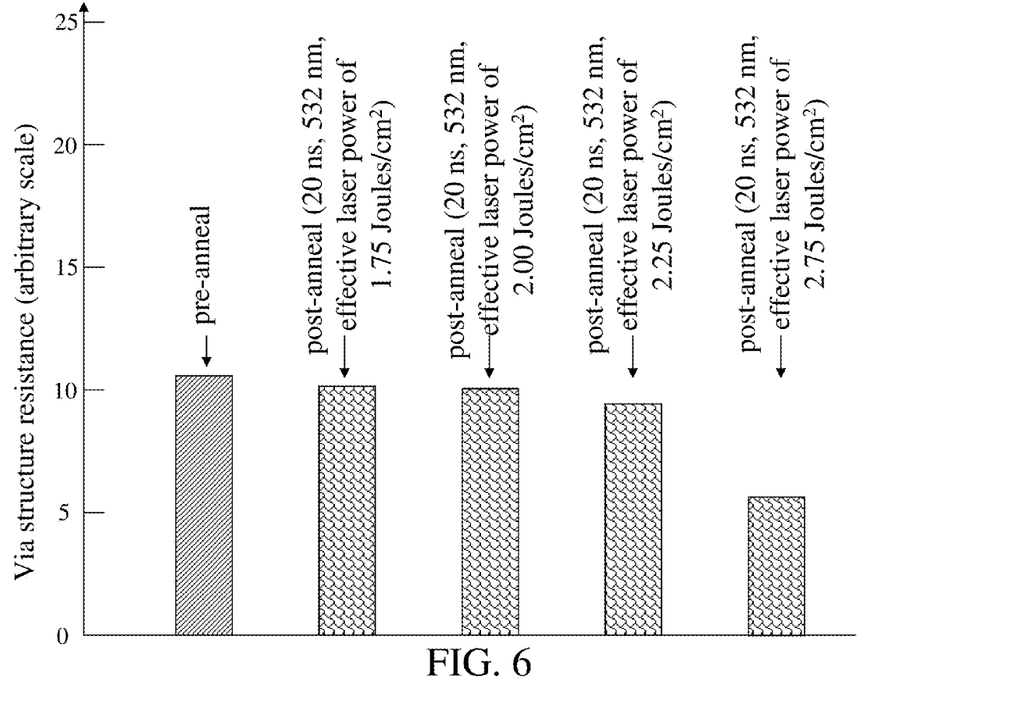
FIG. 6 is a bar chart illustrating reduction the resistance of integrated line and via structures under various laser anneal conditions according to an embodiment of the present disclosure.

Referring to FIG. 6, reduction in the resistance of integrated line and via structures under various laser anneal conditions is illustrated in a bar graph. The width of the metal line portion of the integrated line and via structures was about 40 nm, and the width of the via structure portion of the integrated line and via structures was about less than 40 nm. The overall shape of the integrated line and via structures is as illustrated in FIGS. 8A, 8B, or 8C. Reduction by about 50% in the contact resistance of the via structure was observed for the anneal condition employing the effective laser power of 2.75 mJoule/mm$^2$.

Figure 7A:
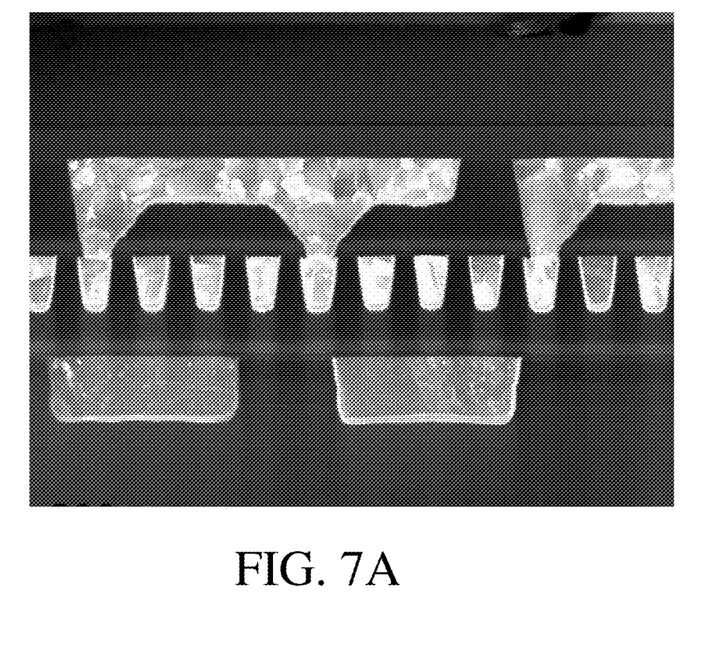
FIG. 7A is a vertical cross-sectional scanning electron micrograph of a sample of an exemplary structure without a laser anneal of the present disclosure.

Referring to FIG. 7A, a vertical cross-sectional scanning electron micrograph of a sample of an exemplary structure without a laser anneal of the present disclosure is shown. Many grain boundaries are visible in the integrated line and via structures in the upper portion of a metal interconnect structure.

Figure 7B:
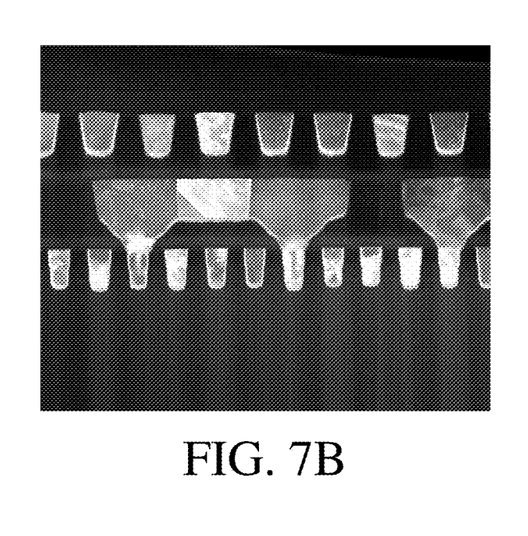
FIG. 7B is a vertical cross-sectional scanning electron micrograph of a first sample of an exemplary structure after a laser anneal of the present disclosure.
Figure 7C:
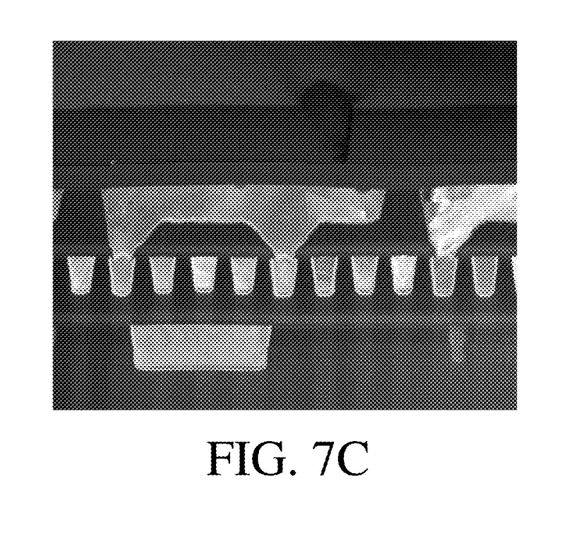
FIG. 7C is a vertical cross-sectional scanning electron micrograph of a second sample of an exemplary structure after a laser anneal of the present disclosure.

Referring to FIGS. 7B and 7C, vertical cross-sectional scanning electron micrographs of samples of an exemplary structure after a laser anneal of the present disclosure are shown. FIG. 8B shows an integrated line and via structure in which the line portion of the integrated line and via structure consists of three grains of a copper-containing material. FIG. 7C shows an integrated line and via structure in which the entirety of the integrated line and via structure consists of a single copper-containing grain. FIG. 7C illustrates that the laser anneal of the embodiments of the present disclosure is capable of producing a metallic structure (42C, 44) in which the recrystallized copper-containing portion 42C consists of only a single grain containing a copper-containing material.

Thus, the methods of the present disclosure can be employed to form copper-containing grains of the sizes that have been hitherto unachievable employing known anneal methods. The complete melting of the copper-containing portion 42C by laser irradiation and the wetting property of the liquid copper-containing portion 42L at the surface of the metallic liner 44 and optionally at the surface of the dielectric cap layer 49 induces formation of the recrystallized copper-containing portion 42C with grain sizes that can be greater than the mean free path of electrons even when the lateral dimension of the metallic structure (42C, 44) is less than the mean free path of electrons of the copper-containing material of the copper-containing portion 42. The increase in the grain size can lower the resistivity of the metallic structure (42C, 44).

Further, formation of voids at the interface with other conductive structures (such as underlying metallic structures (32, 34)) can be avoided due to the wetting property of the liquid copper-containing portion 42L on the surface of other conductive structures. Thus, the resistance of integrated line and via structures (which include the resistance contribution at the interface with other conductive structures) can be reduced as much as 50% under some anneal conditions as illustrated in FIG. 7.

The laser anneal of the present disclosure can form a recrystallized metallic structure (42C, 44) in which the scattering caused by the interfaces of the recrystallized copper-containing portion 42C is mostly specular scattering. This is possible because the molten copper and adjacent material layer form bonding that has minimal amount of dangling bonds and the speed of temperature is fast enough to preserve this preferred bonding arrangement at the interface. Because the longitudinal component of momentum of electrons and the kinetic energy of the electrons are preserved in specular scattering, the contribution to resistivity of specular scattering is insignificant. Thus, in addition to the increase in size of the grains of the recrystallized copper-containing portion 42C of the embodiments of the present disclosure relative to the size of grain boundaries of copper-containing materials of the prior art, the predominantly specular nature of interfacial scattering that is provided only in the structures formed by the embodiments of the present disclosure contribute to reduce the resistivity of the recrystallized copper-containing portion 42C of the embodiments of the present disclosure.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method of annealing a metal interconnect structure comprising:

providing a metal interconnect structure comprising a first metallic structure embedded within at least one dielectric material layer located on a substrate, the first metallic structure comprising a stack of a metallic liner and a first copper-containing portion embedded within said metallic liner, wherein a bottom surface of a dielectric cap layer contacts an entire top surface of said first metallic structure, and wherein each surface of said first metallic structure is in physical contact with said at least one dielectric material layer, an underlying second metallic structure located underneath said first metallic structure, a sidewall surface of an underlying dielectric layer, or said bottom surface of said dielectric cap layer;

melting said first copper-containing portion of said first metallic structure by a laser irradiation, wherein an entirety of said first copper-containing portion melts during said laser irradiation; and cooling said first metallic structure, wherein recrystallization of said first copper-containing portion of said first metallic structure occurs during a cool down period after said laser irradiation, and wherein said recrystallization of said first copper-containing portion proceeds from a bottom surface and sidewall surfaces of a melted state of said first copper-containing portion toward a top surface of said melted state of said first copper-containing portion.

2. The method of claim 1, wherein a wettable interface is formed between said metallic liner and said first copper-containing portion in a melted state during said laser irradiation.

3. The method of claim 1, wherein said first copper-containing portion includes copper at an atomic concentration greater than 90%.

4. The method of claim 1, wherein said metal interconnect structure further comprises a third metallic structure comprising a second copper-containing portion embedded within said at least one dielectric material layer,
wherein a top surface of said third metallic structure is located within a horizontal plane located at, or underneath, another horizontal plane including a bottom surface of said first metallic structure, and said method further comprises simultaneously melting the first copper-containing portion of said first metallic structure and the second copper-containing portion of said third metallic structure by said laser irradiation.

5. The method of claim 4, further comprising simultaneously recrystallizing said first copper-containing portion and said second copper-containing portion.

6. The method of claim 1, wherein said laser irradiation is performed by irradiating a plurality of laser pulses onto said metal interconnect structure.

7. The method of claim 1, wherein said laser irradiation is performed by at least one laser pulse that is irradiated within a time period having a duration less than 1 microsecond at said metallic structure.

8. The method of claim 1, wherein said at least one dielectric material layer includes at least one of undoped silicate glass (USG), a doped silicate glass, a non-porous organosilicate glass (OSG), and a porous organosilicate glass.

9. The method of claim 1, wherein said metallic structure is in physical contact with a dielectric material selected from a porous organosilicate glass (OSG) or a non-porous organosilicate glass.

10. The method of claim 9, wherein a portion of said dielectric material in contact with said metallic structure has a same composition prior to said laser irradiation and after said recrystallization of the first copper-containing portion of said first metallic structure.

11. The method of claim 1, wherein there is at least one non-copper element in said first copper-containing portion, and wherein said at least one non-copper element segregates to a top surface of said first copper-containing portion during said recrystallization of said first copper-containing portion.

12. The method of claim 1 wherein said substrate is a semiconductor substrate having at least one semiconductor device thereupon.

13. The method of claim 12, further comprising scanning a laser beam over different areas of said at least one dielectric material layer during said laser irradiation.

14. The method of claim 1, wherein said metal interconnect structure includes a metal line having a uniform width.

15. The method of claim 1, wherein said metal interconnect structure includes an integrated line and via structure including a metal line and at least one conductive via structure of integral construction with said metal line.

16. A method of annealing a metal interconnect structure comprising:
providing a metal interconnect structure containing a first metallic structure comprising copper or a copper alloy that is embedded within at least one dielectric material layer located on a substrate, wherein a bottom surface of a dielectric cap layer contacts an entire top surface of said first metallic structure, and wherein each surface of said first metallic structure is in physical contact with said at least one dielectric material layer, an underlying second metallic structure located underneath said first metallic structure, a sidewall surface of an underlying dielectric layer, or said bottom surface of said dielectric cap layer;
melting a copper-containing portion of said first metallic structure by a laser irradiation, wherein said laser irradiation comprises irradiating at least one first laser pulse at an infrared wavelength, and irradiating at least one second laser pulse having a wavelength within a visible wavelength range and applied after said at least one first laser pulse, wherein said at least one first laser pulse and said at least one second laser pulse are both irradiated within a single time period having a duration less than 1 microsecond; and
cooling said first metallic structure, wherein recrystallization of said copper-containing portion of said first metallic structure occurs during a cool down period after said laser irradiation.

17. A method of annealing a metal interconnect structure comprising:
providing a metal interconnect structure containing
a first metallic structure comprising copper or a copper alloy that is embedded within at least one dielectric material layer located on a substrate, wherein a bottom surface of a dielectric cap layer contacts an entire top surface of said first metallic structure, and wherein each surface of said first metallic structure is in physical contact with said at least one dielectric material layer, an underlying second metallic structure located underneath said first metallic structure, a sidewall surface of an underlying dielectric layer, or said bottom surface of said dielectric cap layer; and
a third metallic structure comprising copper or another copper alloy that is embedded within said at least one dielectric material layer, wherein a top surface of said third metallic structure is located within a horizontal plane located at, or underneath, another horizontal plane including a bottom surface of said first metallic structure;
simultaneously melting a copper-containing portion of said first metallic structure and a copper-containing portion of said third metallic structure by a laser irradiation; and
cooling said first metallic structure, wherein recrystallization of said copper-containing portion of said first metallic structure occurs during a cool down period after said laser irradiation.

18. The method of claim 17, wherein said laser irradiation is performed by at least one laser pulse that is irradiated within a time period having a duration less than 1 microsecond at said metallic structure.

19. The method of claim 17, further comprising simultaneously recrystallizing said copper-containing portion of said first metallic structure and said copper-containing portion of said third metallic structure.

* * * * *